United States Patent
Pasveer et al.

(10) Patent No.: US 8,357,550 B2
(45) Date of Patent: Jan. 22, 2013

(54) OCCUPANCY SENSOR

(75) Inventors: Willem F. P. Pasveer, Dordrecht (NL); Jaap Haartsen, Eindhoven (NL); Rogier A. H. Niessen, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 13/322,296

(22) PCT Filed: May 7, 2010

(86) PCT No.: PCT/IB2010/052020
§ 371 (c)(1), (2), (4) Date: Nov. 23, 2011

(87) PCT Pub. No.: WO2010/136919
PCT Pub. Date: Dec. 2, 2010

(65) Prior Publication Data
US 2012/0077291 A1   Mar. 29, 2012

(30) Foreign Application Priority Data
May 27, 2009 (EP) .................... 09161189

(51) Int. Cl.
*H01L 21/00* (2006.01)
*H01L 21/02* (2006.01)

(52) U.S. Cl. .............. 438/19; 438/54; 257/E21.002

(58) Field of Classification Search ............ 438/19, 438/54
See application file for complete search history.

(56) References Cited

U.S. PATENT DOCUMENTS

| 2004/0029309 A1 | 2/2004 | Pannek |
| 2007/0117392 A1* | 5/2007 | Smith et al. ............ 438/689 |
| 2007/0254411 A1* | 11/2007 | Uhland et al. ............ 438/127 |
| 2008/0109309 A1 | 5/2008 | Landau et al. |
| 2008/0179525 A1 | 7/2008 | Ikushima et al. |

FOREIGN PATENT DOCUMENTS

| WO | 2005098385 A1 | 10/2005 |
| WO | 2007130628 A2 | 11/2007 |
| WO | 2009150562 A1 | 12/2009 |

OTHER PUBLICATIONS

Technical data sheet 2008(4) of JONDETECH downloaded from http://jondetech.com/documents/datasheet_080617.pdf. Please see the marked portions for search criteria 1.0, Generation "flex" thermopiles downloaded from http://jondetech.com/documents/jondetech_presentation.pdf. Please see the marked portions for search criteria 1.0.

* cited by examiner

*Primary Examiner* — Charles Garber
*Assistant Examiner* — Calvin Choi
(74) *Attorney, Agent, or Firm* — Mark L. Beloborodov (57) ABSTRACT

A method for manufacturing a sensor device (100; 200; 300; 400) comprising a thermal sensor (23), a battery (33), an antenna (34), an electronic circuitry (22) and a solar cell (43) together integrally in one semiconductor carrier (10), the method comprising the steps of:—providing a silicon wafer (10) with two main surfaces (11, 12); a first functional layer (20) is manufactured in one main surface (11), comprising a thermal sensor portion (21) and comprising electronic circuitry (22) arranged in a non-overlapping relationship with the thermal sensor portion; a second functional layer (30) containing a battery (33) and an antenna (34) is arranged in a non-overlapping relationship with the thermal sensor portion; a third functional layer (40) containing one or more solar cells (43) is arranged in a non-overlapping relationship with the thermal sensor portion; the portion of the wafer underneath the thermal sensor portion (21) is removed.

15 Claims, 9 Drawing Sheets

FIG. 8 ns in a manufacturing process for manufacturing a first embodiment of a sensor device according to the present invention;
OCCUPANCY SENSOR

FIELD OF THE INVENTION

The present invention relates in general to a sensor device capable of detecting the presence of one or more human beings in a room, and capable of outputting a detection signal suitable for, for instance, switching lamps or even more intelligent control of ambient parameters in a building.

BACKGROUND OF THE INVENTION

There is a general desire to save energy. One field of such energy saving is lighting in buildings, particularly office buildings but also residential buildings. Work is being done to develop highly efficient light sources, which consume less energy and still produce the same amount of light. However, an important energy saving can also be achieved if lights are automatically switched off if they are not needed; in this respect, a light may be considered as being not needed if the area illuminated by this light is not occupied by a person (in practice, more refined definitions can be used). Thus, there is a need for an occupancy sensor.

For being able to switch a lamp, there must be a communication link between the occupancy sensor and the lamp. It is desirable that such link is wireless. This will save on installation costs, and will make it much easier to install occupancy sensors in the case of an already existing lighting infrastructure in already existing buildings. Also, the absence of wires will be aesthetically much more acceptable.

Unavoidably, a sensor device would require power. Power can be supplied from mains, but this requires power lines. Therefore, power is preferably provided by a battery, but in that case the sensor device must have low power consumption in order to have a long life time. In this respect, it would be preferred if the sensor device would be capable of energy harvesting, particularly if the sensor device would be provided with a solar cell, i.e. a cell capable of converting light energy to electric energy. It would even be more preferred if the sensor device would be capable of RF energy harvesting.

Further, from an esthetical point of view, people would not like to have a bulky sensor device mounted at their ceiling or walls. Most desirably, the sensor device should be practically invisible.

SUMMARY OF THE INVENTION

The present invention aims to provide a sensor device capable of meeting the above design aspects.

In one aspect, the present invention provides a sensor device comprising a sensor, a battery, a transmitter and a solar cell manufactured integrally in one semiconductor body.

In another aspect, the present invention provides a method for manufacturing a sensor device comprising a sensor, a battery, a transmitter and a solar cell together integrally in one semiconductor carrier.

Further advantageous elaborations are mentioned in the dependent claims.

BRIEF DESCRIPTION OF THE DRAWINGS

These and other aspects, features and advantages of the present invention will be further explained by the following description of one or more preferred embodiments with reference to the drawings, in which same reference numerals indicate same or similar parts, and in which:

FIGS. 2A-2G schematically illustrate subsequent stages in a manufacturing process for manufacturing a second embodiment of a sensor device according to the present invention;

DETAILED DESCRIPTION OF THE INVENTION

FIGS. 1A-1E schematically illustrate subsequent stages in a manufacturing process for manufacturing a first embodiment of a sensor device 100 according to the present invention.

Figure 1A:
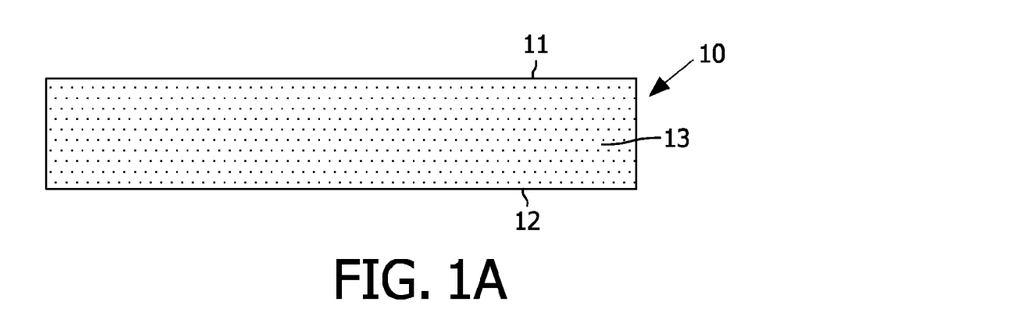
FIGS. 1A-1E schematically illustrate subsequent stages in a manufacturing process for manufacturing a first embodiment of a sensor device according to the present invention.

In a first step, a silicon wafer 10 is provided. As illustrated in FIG. 1A, the wafer has a wafer body 13 with two main surfaces 11 and 12. A first main surface 11 will be indicated as top surface and the opposite main surface will be indicated as back surface.

Figure 1B:
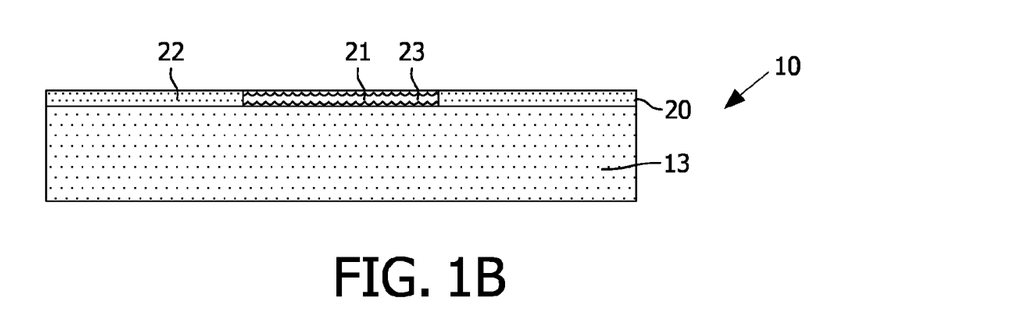

In a first processing stage, illustrated in FIG. 1B, a first functional layer 20 is manufactured in or on the top surface 11. The first functional layer 20 is manufactured such as to comprise a thermal sensor portion 21 with a thermal sensor 23 at a central location in the first functional layer 20, and electronic circuitry 22 arranged around the thermal sensor portion 21. A suitable design for the thermal sensor portion 21 will be discussed later.

The design of the electronic circuitry 22 is basically a free choice of the device designer, depending among other things on the intended use of the sensor, so it is not needed to discuss this design in great detail here. Suffice it to say that the electronic circuitry 22 will be capable of receiving and processing an output signal from the thermal sensor 23. For instance, the circuitry 22 may include microprocessing capability.

The processes used for manufacturing the thermal sensor portion 21 and the electronic circuitry 22 may be standard processes that are common in the field of IC manufacturing, so a detailed explanation of such processes is not needed here. It is noted that a suitable technology, especially for making the electronic circuitry 22, is CMOS technology.

As should be clear to a person skilled in the art, the first functional layer 20 actually comprises a laminate of multiple films arranged is successive steps. These films may include one or more ceramic films, that can act as an etch stop in later etching steps, as will become clearer later.

Figure 1C:
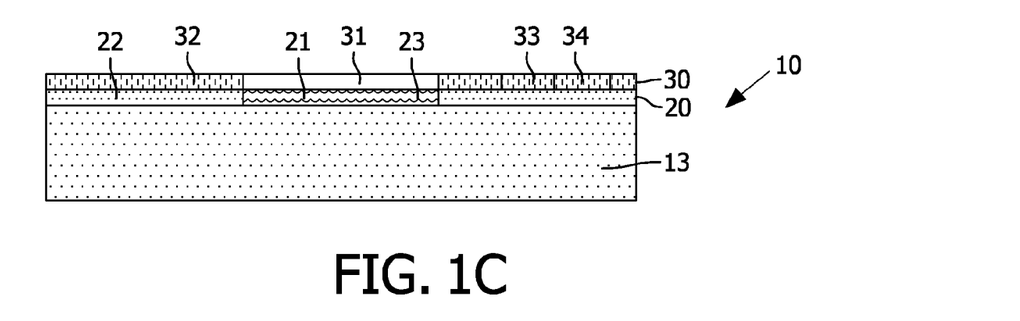

In a second processing stage, illustrated in FIG. 1C, a second functional layer 30 is manufactured on the first functional layer 20. The second functional layer 30 does not completely cover the first functional layer 20, but it comprises a ring-shaped material portion 32 around an empty space 31. This empty space 31 is aligned with the thermal sensor portion 21, and has the same or larger size as the thermal sensor portion 21, so that the ring-shaped material portion 32 leaves the thermal sensor portion 21 completely free: there is no overlap with the thermal sensor 23. It is noted that the second functional layer 30 may be deposited in a ring shape, but it is also possible to deposit the second functional layer 30 over the entire first functional layer 20 and to then partly remove, for instance by etching, the material over the thermal sensor portion 21 so as to leave the ring-shaped material portion 32.

The second functional layer 30 contains a battery, only schematically indicated at 33. The battery 33 has a function of powering the circuitry 22. It is noted that thin film processing used for manufacturing a battery on a semiconductor carrier are known per se, so that a more detailed explanation of such battery design and manufacturing process is not needed here. Several designs for such battery are known, and those known designs can be used here. Preferably, the battery is a solid state battery.

The second functional layer 30 further contains an antenna, only schematically indicated at 34. The antenna has a function of allowing the circuitry 22 to communicate, i.e. to receive command signals and/or to transmit detection signals. Thus, specifically, the circuitry 22 may include a transmitter function, a receiver function, or a transceiver function. It is noted that methods for applying an antenna on a semiconductor carrier are known per se, so that a more detailed explanation of such antenna design and manufacturing process is not needed here. However, it is noted that such design typically includes a metal line deposited on the semiconductor carrier, possibly spiral-shaped. It is further noted that, apart from such communication antenna, it is possible that the second functional layer 30 contains an RF harvesting antenna, or that one antenna is used for communication as well as for RF harvesting.

It is further noted that the manufacturing process for manufacturing the second functional layer 30 is executed at a relatively low temperature, preferably less than 400° C., so that the components in the first functional layer 20 are not affected by the manufacturing process. A suitable example of an all-solid state battery that is capable of being fully manufactured by processing steps below said temperature limit comprises vanadium oxide active electrodes and lithium phosphate-based solid electrolyte.

Figure 1D:
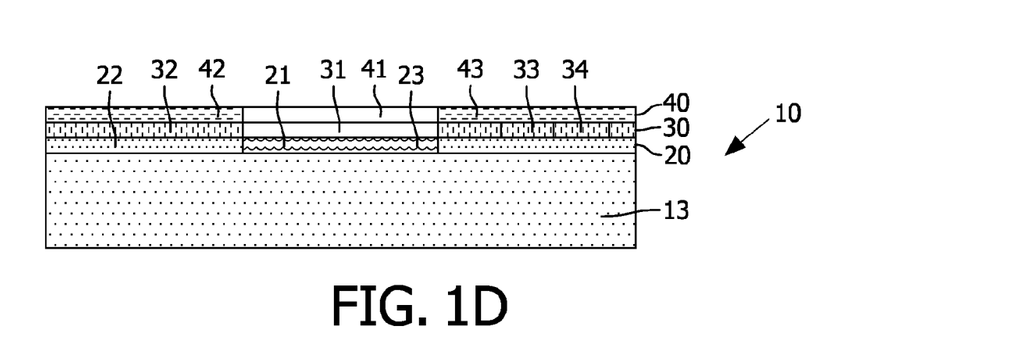

In a third processing stage, illustrated in FIG. 1D, a third functional layer 40 containing one or more solar cells 43 is manufactured on the second functional layer 30. Similar as with the second functional layer 30, the third functional layer 40 does not completely cover the second functional layer 30, but it comprises a ring-shaped material portion 42 around an empty space 41. This empty space 41 is aligned with the thermal sensor portion 21, and has the same or larger size as the thermal sensor portion 21, so that the ring-shaped material portion 42 leaves the thermal sensor portion 21 completely free: there is no overlap with the thermal sensor 23. It is noted that the third functional layer 40 may be deposited in a ring shape, but it is also possible to deposit the third functional layer 40 over the entire second functional layer 30 and to then partly remove, for instance by etching, the material over the thermal sensor portion 21 so as to leave the ring-shaped material portion 42.

It is noted that processes for manufacturing a solar cell on a semiconductor carrier are known per se, so that a more detailed explanation of such solar cell design and manufacturing process is not needed here. Several designs for such solar cell are known, and those known designs can be used here.

It is further noted that the manufacturing process for manufacturing the third functional layer 40 is executed at a temperature lower than the temperature of the manufacturing process for manufacturing the second functional layer 30, preferably less than 300° C., so that the components in the second functional layer 30 are not affected by the manufacturing process. Suitable examples of the manufacturing process are Hot Wire Chemical Vapour Deposition (HWCVD) for producing polychrystalline silicon solar cells, or low temperature Plasma Enhanced Chemical Vapour Deposition (PECVD) for producing amorphous silicon solar cells.

Figure 1E:
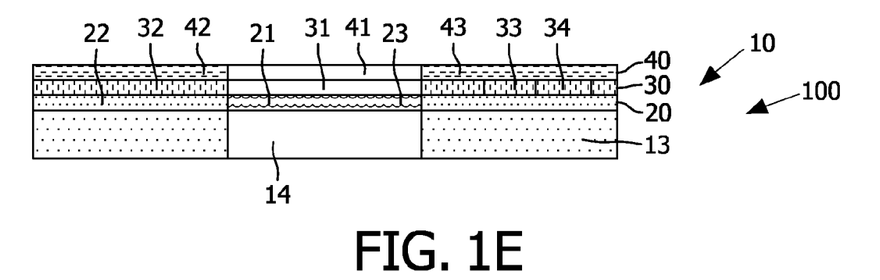

In a fourth processing stage, illustrated in FIG. 1E, the portion of the wafer body 13 underneath the thermal sensor portion 21 is removed, such as to result in a recess 14 having a depth reaching from the bottom surface 12 side to the thermal sensor portion 21 in the first functional layer 20. Outside this recess 14, part of the wafer body 13 may also be removed in order to reduce the body thickness, as illustrated.

It is noted that suitable processes for removing semiconductor material are known per se, so that a more detailed explanation of such process is not needed here. By way of example, suitable examples of such process are reactive ion etching, or sputter etching, or wet chemical etching. It is further noted that the etching process stops by an etch stop incorporated in the first functional layer 20, such as a ceramic layer mentioned earlier. Such ceramic layer is not shown separately for sake of simplicity.

It is noted that the electrical connections from the solar cell to the battery can easily be provided by suitable design of the topography of the battery and the solar cell, since the solar cell is manufactured directly on top of the battery, as should be clear to a person skilled in the art. Likewise, the electrical connections from the battery to the electronic circuitry 22 can easily be provided by suitable design of the topography of the battery and the electronic circuitry 22, since the battery is manufactured directly on top of the electronic circuitry 22.

It is noted that the respective thicknesses of the layers 20, 30, 40 are exaggerated in the figures. Although the precise dimensions are not essential, by way of example:

the thickness of the wafer body may typically be in the order of 700 µm or less, the thickness of the first functional layer 20 may typically be in the range of 1-5 µm, the thickness of the second functional layer 30 may typically be in the range of 2-50 µm, the thickness of the third functional layer 40 may typically be in the range of 0.1-10 µm, and the thickness of the entire device after removal of part of the wafer body may typically be less than 200 µm.

Further, the surface area of the entire device may typically be in the range of 0.1-10 cm$^2$ while the surface area of the thermal sensor portion 21 may typically be in the range of 0.025-1 cm$^2$.

The sensor device 100 obtained in this way is very small, and has the advantage of being very flexible due to its small thickness.

Figure 1F:
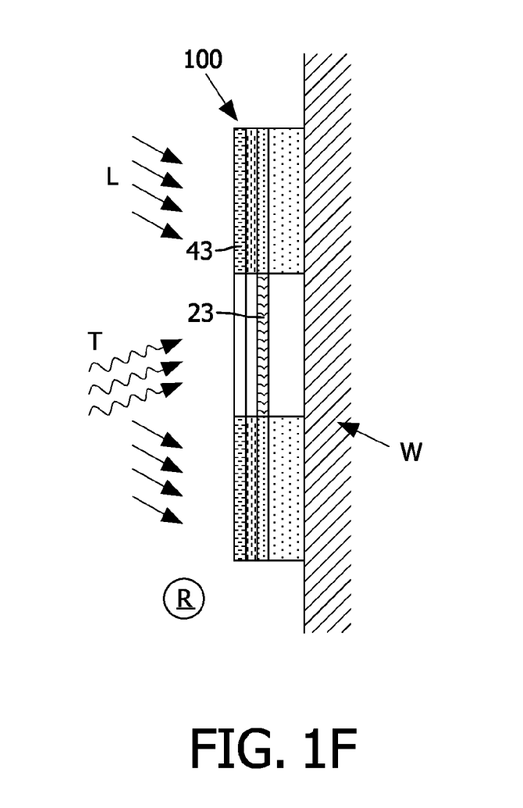
FIG. 1F schematically illustrates the first embodiment of the sensor device attached to a wall of a room.

FIG. 1F schematically illustrates the use of the sensor device 100. The device 100 is attached to a wall W of a room R, oriented such that the bottom surface of the wafer 10 is directed towards the wall W while the third functional layer 40 with the solar cell(s) 43 is directed towards the interior of the room R. Thus, the solar cell(s) 43 can receive interior light L while the thermal sensor 23 can receive thermal radiation T. In this concept, the wafer 10 acts as carrier for the active layers 20, 30, 40.

Figure 2A:
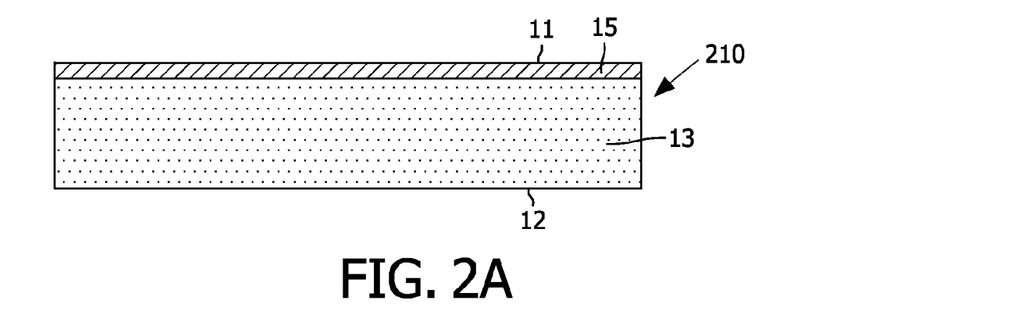
Figure 2B:
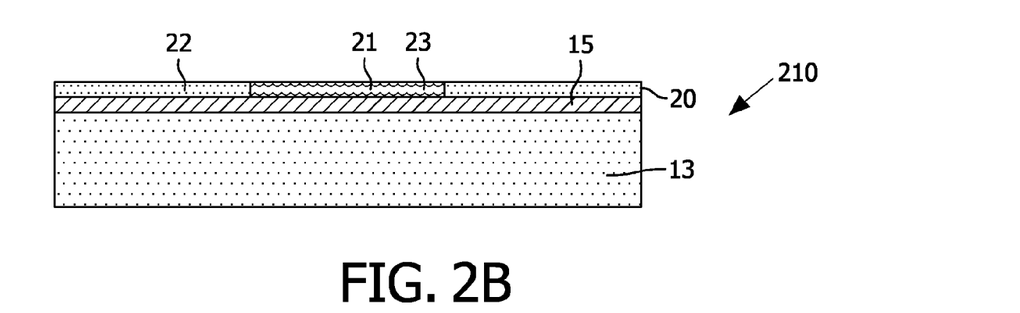
Figure 2C:
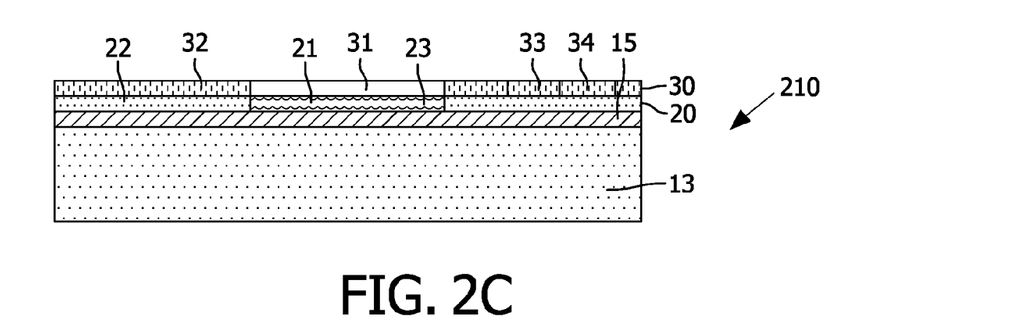
Figure 2D:
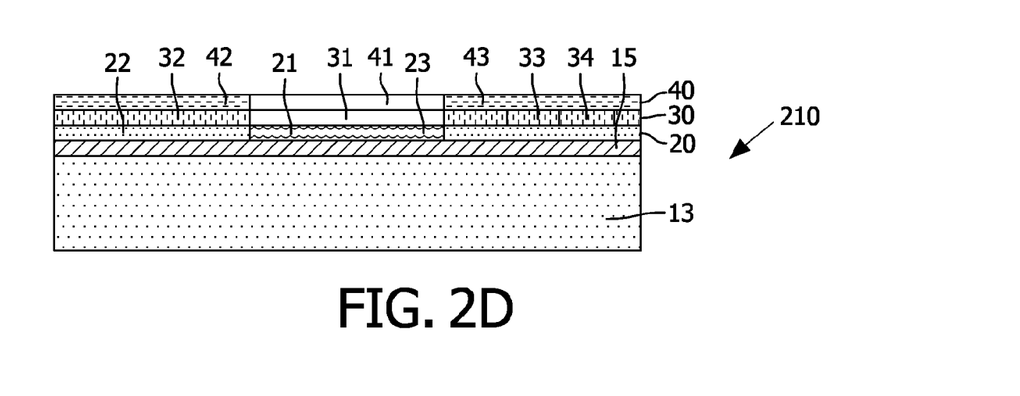
Figure 2E:
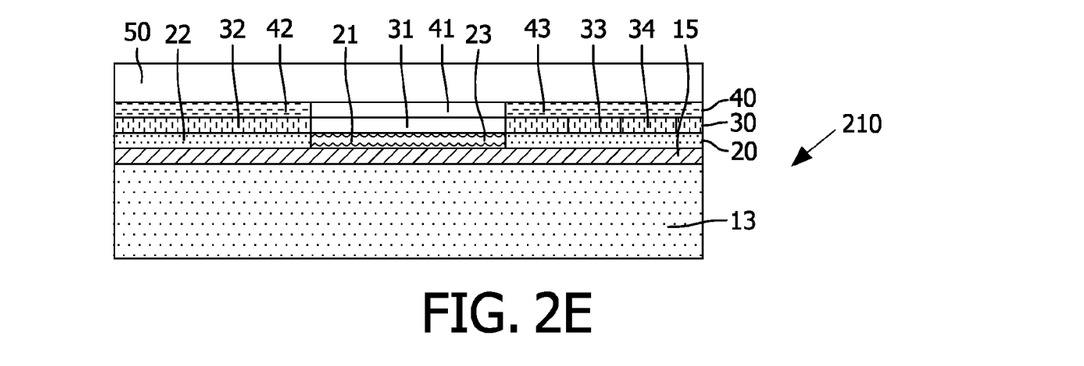
Figure 2F:
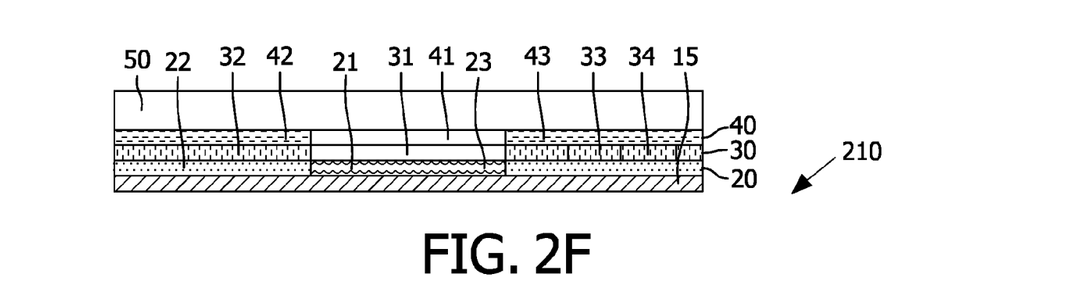
Figure 2G:
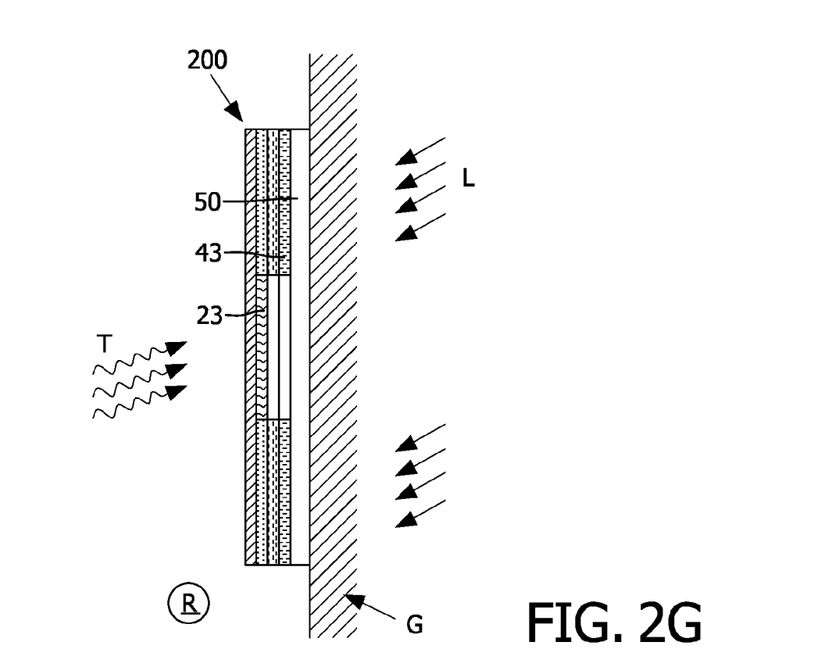
FIG. 2G schematically illustrates the second embodiment of the sensor device attached to a window of a room.

It may be desirable to mount a sensor device such that it can receive solar light. To this end, a second embodiment of a sensor device 200 according to the present invention comprises a carrier plate 50 on top of the third functional layer 40 with the solar cell(s) 43. FIG. 2G schematically illustrates the use of this sensor device 200. The device 200 is attached to a glass window G of a room R, oriented such that the bottom surface of the wafer 10 is directed towards the interior of the room R while the third functional layer 40 with the solar cell(s) 43 is directed towards the window G. Thus, the solar cell(s) 43 can receive outside light L while the thermal sensor 23 can receive thermal radiation T from inside the room. In this concept, the carrier plate 50 acts as carrier for the active layers 20, 30, 40.

FIGS. 2A-2F schematically illustrate subsequent stages in a manufacturing process for manufacturing this second embodiment of sensor device 200 according to the present invention. The wafer is indicated at 210, and differs from the wafer 10 of the first embodiment in that the wafer is a silicon-on-insulator wafer; reference numeral 15 indicates an oxide layer on the top surface 11. This oxide layer 15 is useful for back-etching, but is not essential, so that it is not essential that the wafer 210 is SOI. On the other hand, the wafer 10 of the first embodiment may also be SOI.

In this embodiment the first processing step (illustrated in FIG. 2B), second processing step (illustrated in FIG. 2C), third processing step (illustrated in FIG. 2D) and fourth processing step (illustrated in FIG. 2F) are the same as in the first embodiment, so their description will not be repeated. Deviating from the first embodiment is a fifth processing step executed between the third and fourth processing steps. In this fifth processing step, illustrated in FIG. 2E, a glass substrate 50 is attached to the third functional layer 40 (or, vice versa, the wafer 210 is attached to the substrate). Attachment can be performed using a suitable adhesive (not shown) arranged on the third functional layer 40. The glass is sufficiently stiff so as not to touch the thermal sensor portion 21, allowing the glass substrate 50 to extend over the thermal sensor portion 21 in order to function as a cover and protection. In a suitable embodiment, the glass substrate 50 has a thickness of about 200 μm or more.

Since methods for gluing a wafer on a glass substrate are known per se, a more detailed explanation is not needed here. It is however noted that the spaces 31 and 41 above the thermal sensor 23 should remain empty, i.e. any adhesive should not touch the thermal sensor 23. It is possible to apply the adhesive on the glass substrate and then to attach the glass substrate and the wafer to each other. It is also possible to apply the adhesive on the top surface of the wafer (i.e. on the third layer 40), for instance by spinning, and then to attach the glass substrate and the wafer to each other. In both cases, if it is not possible to keep the adhesive away from the thermal sensor 23, it is possible to remove excess adhesive from the thermal sensor by back etching, as should be clear to a person skilled in the art. It is noted that in the fourth step the wafer material is etched away completely, the oxide layer 15 being used as an etch stop. As a result, the mechanical properties of the device are mainly determined by the glass plate.

With reference to FIG. 2G, it is noted that solar light L also contains infrared light. In order for the thermal sensor 23 to have sufficient sensitivity for the thermal radiation T, the glass plate 50 functions to block all thermal radiation from outside. This function can be improved by applying to the glass plate surface an anti-reflection coating (not shown). In the above-described embodiment, the carrier plate 50 is made from glass. Instead of glass, it is possible to use another transparent material. In a particularly preferred embodiment, the carrier plate 50 can be made from polyimide. In order to facilitate handling as far as etching is concerned, it is preferred that a glass plate is attached to the polyimide plate before etching and to remove this glass plate after etching. These steps are not individually illustrated for sake of simplicity.

In the embodiments discussed in the above, all functional layers 20, 30, 40 are arranged at the same side of the wafer substrate. Alternatively, it is also possible to have functional layers arranged at opposite sides of the wafer substrate. In all cases, the first functional layer with the thermal sensor 23 and the circuitry 22 will be arranged on the silicon substrate 13.

Figure 3A:
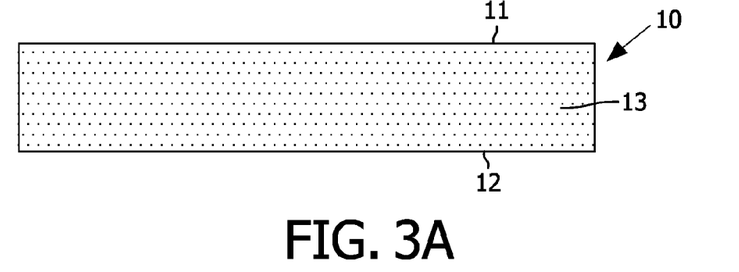
FIGS. 3A-3E schematically illustrate subsequent stages in a manufacturing process for manufacturing a third embodiment of a sensor device according to the present invention.
Figure 3B:
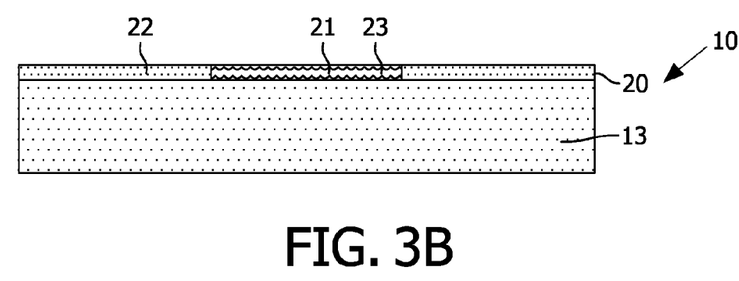
Figure 3C:
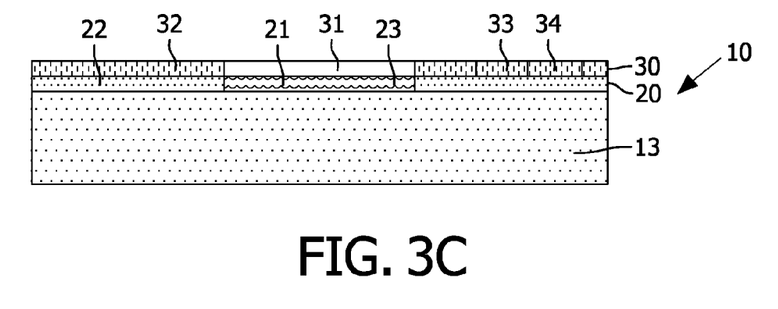
Figure 3D:
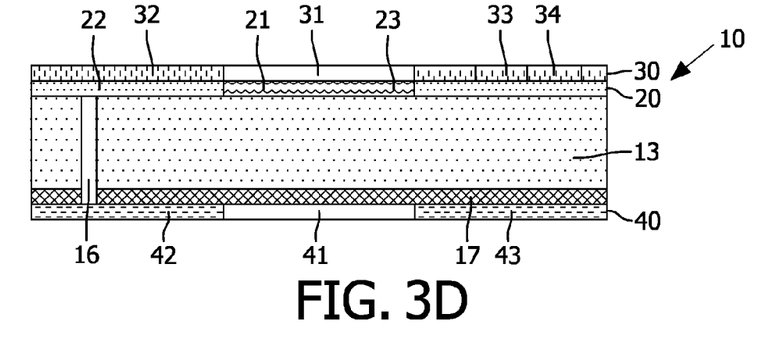
Figure 3E:
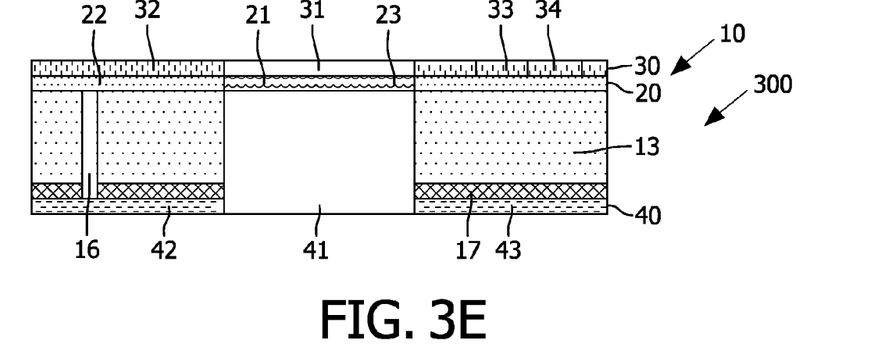

In a third embodiment of a sensor device 300, the solar cell is arranged opposite the thermal sensor. FIGS. 3A-3E schematically illustrate subsequent stages in a manufacturing process for manufacturing this third embodiment of sensor device 300 according to the present invention. The first steps as illustrated by FIGS. 3A-3C are identical to the first steps illustrated in FIGS. 1A-1C. Deviating from the first embodiment, vias 16 are formed in the substrate 13, an oxide separation layer 17 is formed on the bottom surface 12 of the wafer, and then the third functional layer 40 is manufactured on the said oxide separation layer, as illustrated in FIG. 3D. The vias serve to provide electrical contact between the solar cells 43 and the circuitry 22. Finally, the step of removing substrate from under the thermal sensor portion 21 as illustrated in FIG. 3E is identical to the step illustrated in FIG. 1E, it being noted that the oxide layer is also removed from under the thermal sensor portion 21.

It is noted that, in a variation, depending on the choice of material for the solar cells and the battery, the third functional layer 40 may be arranged before the second functional layer 30 and even may be arranged before the first functional layer 20.

Figure 4A:
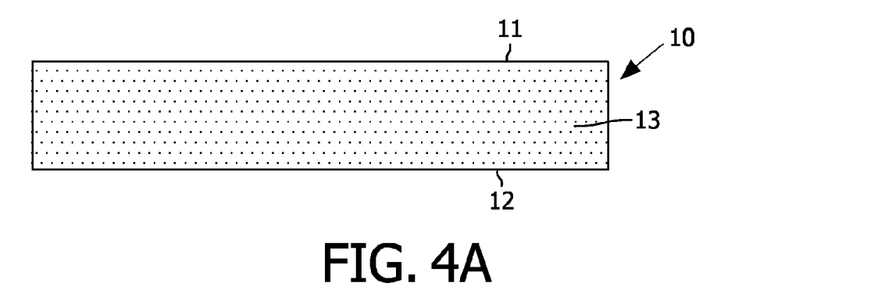
FIGS. 4A-4E schematically illustrate subsequent stages in a manufacturing process for manufacturing a fourth embodiment of a sensor device according to the present invention.
Figure 4B:
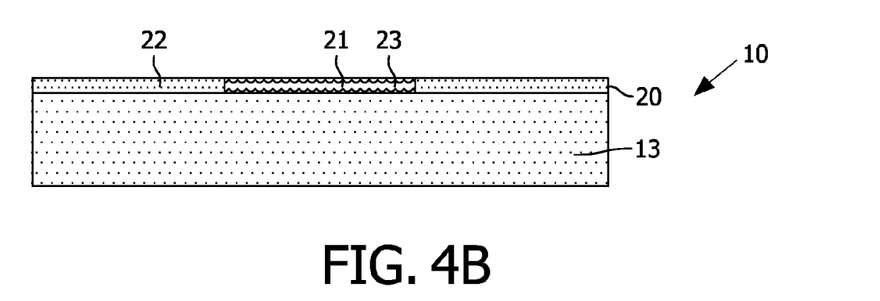
Figure 4C:
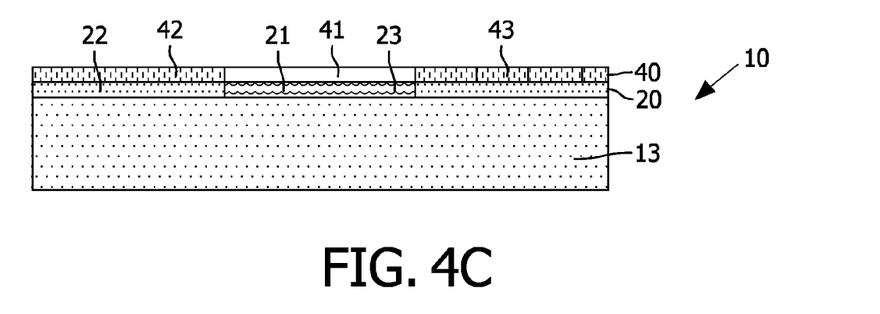
Figure 4D:
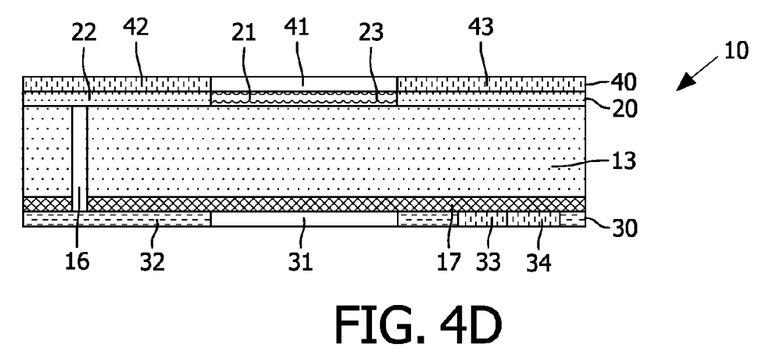
Figure 4E:
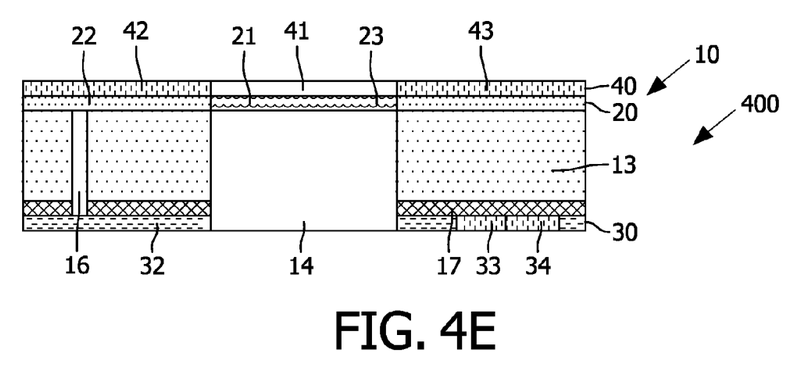

In a fourth embodiment of a sensor device 400, the battery is arranged opposite the thermal sensor. FIGS. 4A-4E schematically illustrate subsequent stages in a manufacturing process for manufacturing this fourth embodiment of sensor device 400 according to the present invention. The first steps as illustrated by FIGS. 4A-4B are identical to the first steps illustrated in FIGS. 3A-3B. Then the third functional layer 40 with the solar cells 42 is manufactured on the first functional layer 20, as illustrated in FIG. 4C. Vias 16 are formed in the substrate 13, an oxide separation layer 17 is formed on the bottom surface 12 of the wafer, and then the second functional layer 30 is manufactured on the said oxide separation layer, as illustrated in FIG. 4D. The vias serve to provide electrical contact between the battery 33 and the circuitry 22. Finally, the step of removing substrate from under the thermal sensor portion 21 as illustrated in FIG. 4E is identical to the step illustrated in FIG. 3E.

Figure 5:
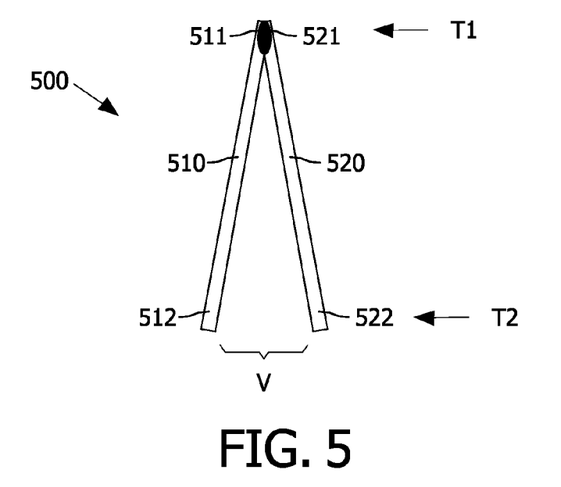
FIG. 5 schematically illustrates a thermocouple.

FIG. 5 schematically illustrates the basic design of a thermocouple, generally indicated by reference numeral 500. The thermocouple 500 comprises two conductive lines 510 and 520 of mutually different material, each having a first end 511, 521 and each having a second end 512, 522. The first ends 511, 521 of the lines 510, 520 are connected together. Assume that the joint of first ends 511, 521 is held at a first temperature T1, and that the second ends 512, 522 are held at mutually the same temperature T2 differing from T1: a voltage difference V can be measured between these two second ends 512, 522, which voltage is proportional to the temperature difference |T1−T2|, the proportionality constant depending on the choice of materials. Since this design is generally known, a further explanation is not needed here.

Figure 6:
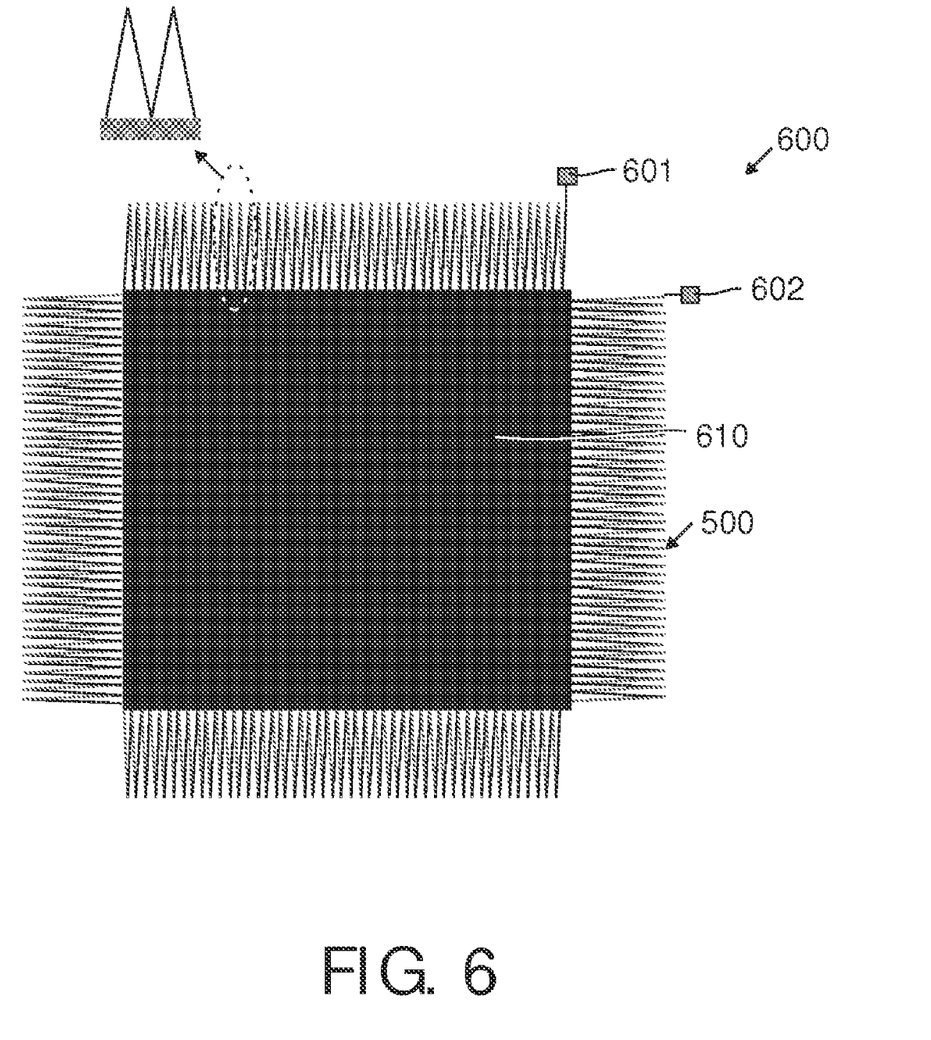
FIG. 6 schematically illustrates a design for a thermal sensor.

FIG. 6 schematically illustrates a design of a thermal sensor 600 according to the present invention, suitable for use as the thermal sensor portion 21 mentioned earlier. The thermal sensor 600 comprises a central body 610, which may suitable have a square shape, as shown, and which is mounted with as little thermal conduction to its environment as possible.

Alongside its edges, a plurality of thermocouples 500 is arranged. Of each thermocouple 500, the joint of first ends 511, 521 is always connected to the central body 610. Further, the free second ends of adjacent thermocouples are connected together, as shown in the partial enlargement, so that all thermocouples are electrically connected in series while thermally being connected in parallel. End terminals of this series arrangement are shown at 601 and 602. The central body 610 and the thermocouples 500 are implemented as patterns in silicon. The central body 610 is designed to have a relatively large surface area that is heat-absorbing, i.e. absorbing infrared radiation. A well-suitable material is black gold. The conductive lines 510 and 520 may for instance be made as n-doped and p-doped polysilicon.

The central body 610 is mounted to receive IR radiation and is implemented in a thin region of silicon, so that it absorbs radiation and rises in temperature without the elevated temperature flowing away easily. The conductive lines 510 and 520 may be arranged in a thicker portion of silicon, so that they are better cooled. A voltage difference is developed between the end terminals 601, 602, that can directly be used by circuitry arranged in the same chip. It is noted that this sensing voltage does not depend on any supply voltage. It is further noted that the response time of such device is short, in the order of about 10 ms.

Figure 7:
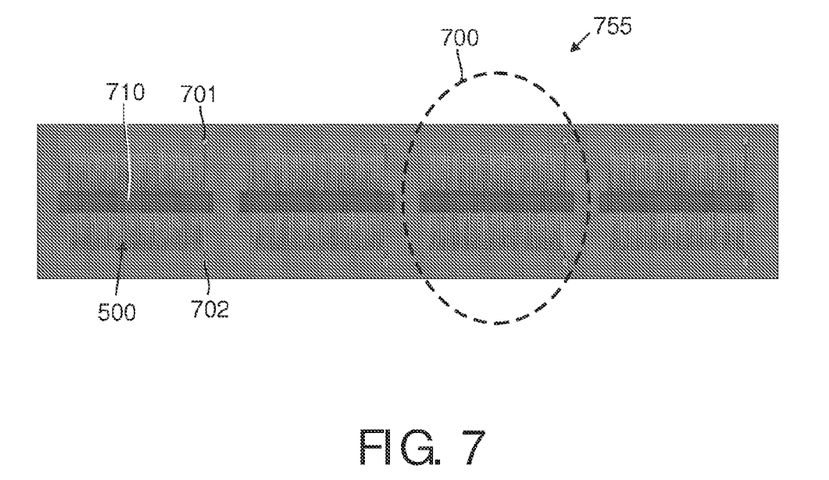
FIGS. 7 and 8 schematically illustrate alternative designs for a thermal sensor.
Figure 8:
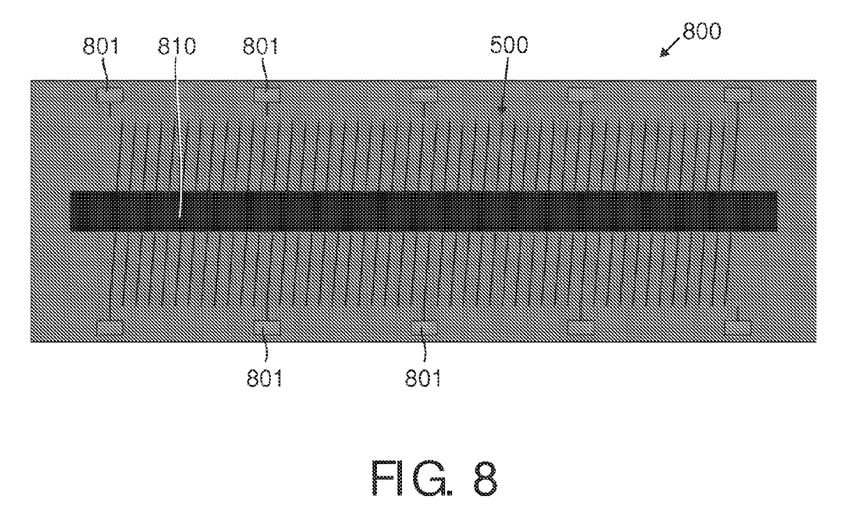

In the embodiment of FIG. 6, the sensing surface area is relatively large. FIGS. 7 and 8 illustrate embodiments capable of indicating on which part of the sensor the thermal energy is received. In FIG. 7, the sensor device 755 comprises four individual sensors 700, each sensor 700 comprising a central longitudinal body 710 having thermocouples 500 arranged along the opposing longitudinal edges, with end terminals 701 and 702. In FIG. 8, the sensor device 800 comprises a central longitudinal body 810 having thermocouples 500 arranged along the opposing longitudinal edges, with terminals 801 arranged not only at the end but also at intermediate locations, so that sensor signals can be obtained from different portions of the sensor.

An important advantage is that the flexible sensor 755, 800 can be bent so that the different sensor portions can receive thermal radiations from different directions. Thus, it is not only possible to detect the presence of a person, but also to detect a location of such person, and/or to detect a direction of movement of such person.

Summarizing, the present invention provides a method for manufacturing a sensor device 100; 200; 300; 400 comprising a thermal sensor 23, a battery 33, an antenna 34, an electronic circuitry 22 and a solar cell 43 together integrally in one semiconductor carrier 10. The method comprises the steps of:

providing a silicon wafer 10 with two main surfaces 11, 12;

a first functional layer 20 is manufactured in one main surface 11, comprising a thermal sensor portion 21 and comprising electronic circuitry 22 arranged in a non-overlapping relationship with the thermal sensor portion;

a second functional layer 30 containing a battery and antenna is arranged in a non-overlapping relationship with the thermal sensor portion;

a third functional layer 40 containing one or more solar cells is arranged in a non-overlapping relationship with the thermal sensor portion;

the portion of the wafer underneath the thermal sensor portion 21 is removed.

While the invention has been illustrated and described in detail in the drawings and foregoing description, it should be clear to a person skilled in the art that such illustration and description are to be considered illustrative or exemplary and not restrictive. The invention is not limited to the disclosed embodiments; rather, several variations and modifications are possible within the protective scope of the invention as defined in the appending claims. For instance, it is not absolutely essential that the electronic circuitry 22, battery 33, antenna 34 and solar cell 43 surround the thermal sensor 23; it is also possible that the electronic circuitry 22, battery 33, antenna 34 and solar cell 43 are arranged next to the thermal sensor 23, as long as there is no overlap. Further, it is possible that the electronic circuitry 22 and the thermal sensor 23 are arranged in different adjacent layers, but it is preferred that the electronic circuitry 22 and the thermal sensor 23 are arranged in the same layer.

In the above, details of the battery manufactured on the carrier have not been specified, since manufacturing batteries on a silicon carrier is known per se. It is noted that it is possible to use a 2D design or a 3D design; in the latter case, it will be beneficial to deposit a layer of amorphous silicon and to subsequently etch cavities of arbitrary shape in this amorphous silicon to create the desired 3D structure, and finally deposit the battery, as should be clear to a person skilled in the art.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. Method for manufacturing a sensor device comprising a thermal sensor, a battery, an antenna, an electronic circuitry and a solar cell together integrally in one semiconductor carrier, the method comprising the steps of:

providing a silicon wafer having a wafer body with two opposite, mutually parallel main surfaces;

in a first processing stage, manufacturing a first functional layer in or on one of said main surfaces, comprising a thermal sensor portion with at least one thermal sensor, and manufacturing a functional layer comprising electronic circuitry arranged in a non-overlapping relationship with the thermal sensor portion;

in a second processing stage following the first processing stage, manufacturing a second functional layer having a material portion containing a battery and an antenna arranged in a non-overlapping relationship with the thermal sensor portion;

in a third processing stage following the first processing stage, manufacturing a third functional layer having a material portion containing one or more solar cells arranged in a non-overlapping relationship with the thermal sensor portion;

in a fourth processing stage following the third processing stage, the portion of the wafer body underneath the thermal sensor portion is removed, such as to result in a recess having a depth reaching from the bottom surface side to the thermal sensor portion in the first functional layer.

2. Method according to claim 1, wherein the electronic circuitry and the thermal sensor portion are manufactured in the same functional layer.

3. Method according to claim 2, wherein the electronic circuitry and the thermal sensor portion are manufactured with the same processing steps.

4. Method according to claim 1, wherein the second functional layer comprises a void aligned with the thermal sensor portion, and/or wherein the third functional layer comprises a void aligned with the thermal sensor portion.

5. Method according to claim 1, wherein the manufacturing process for manufacturing the second functional layer is executed at a relatively low temperature, preferably less than 400° C., so that the components in the first functional layer are not affected by this manufacturing process.

6. Method according to claim 1, wherein the third processing stage is performed following the second processing stage.

7. Method according to claim 6, wherein the manufacturing process for manufacturing the third functional layer is executed at a temperature lower than the temperature of the manufacturing process for manufacturing the second functional layer, preferably less than 300° C., so that the components in the second functional layer are not affected by this manufacturing process.

8. Method according to claim 1, wherein the second functional layer with battery and antenna is manufactured on the first functional layer, and wherein the third functional layer with solar cell(s) is manufactured on the second functional layer.

9. Method according to claim 1, wherein the second functional layer with battery and antenna is manufactured on the first functional layer, and wherein the third functional layer with solar cell(s) is manufactured on the second of said main surfaces.

10. Method according to claim 1, wherein the second functional layer with battery and antenna is manufactured on the second of said main surfaces, and wherein the third functional layer with solar cell(s) is manufactured on the first functional layer.

11. Method according to claim 1, wherein the third functional layer with solar cell(s) is manufactured as outermost layer, and wherein a carrier plate is arranged on top of this third functional layer, the carrier plate preferably being made from glass or polyimide.

12. Sensor device comprising a thermal sensor, a battery, an antenna, an electronic circuitry and a solar cell manufactured integrally in one semiconductor body with a method according to claim 1.

13. Sensor device according to claim 12, wherein the thermal sensor comprises a thin central body and a plurality of thermocouples arranged along the edges of the central body;
wherein the central body is designed to be heat-absorbing;
wherein all thermocouples are electrically connected in series while thermally being connected in parallel;
and wherein the central body and the thermocouples are implemented as patterns in silicon.

14. Sensor device according to claim 12, wherein the thermal sensor comprises four individual sensor portions, each sensor portion comprising a thin central longitudinal body and a plurality of thermocouples arranged along the opposing longitudinal edges of the central body.

15. Sensor device according to claim 12, wherein the thermal sensor comprises a thin central longitudinal body and a plurality of thermocouples arranged along the opposing longitudinal edges of the central body, with terminals contacting the end thermocouples and also terminals contacting at intermediate thermocouples, so that sensor signals can be obtained from different portions of the sensor.

\* \* \* \* \*